United States Patent [19]
Vittoria

[11] Patent Number: 5,320,881
[45] Date of Patent: Jun. 14, 1994

[54] FABRICATION OF FERRITE FILMS USING LASER DEPOSITION

[75] Inventor: Carmine Vittoria, Newton, Mass.

[73] Assignee: Northeastern University, Boston, Mass.

[21] Appl. No.: 924,734

[22] Filed: Aug. 4, 1992

Related U.S. Application Data

[63] Continuation-in-part of Ser. No. 750,626, Aug. 27, 1991, Pat. No. 5,227,204.

[51] Int. Cl.$^5$ ............................. B05D 3/06; B05D 5/12
[52] U.S. Cl. ................................. 427/596; 427/561; 427/126.2; 427/126.6; 427/128; 427/131
[58] Field of Search ............... 427/561, 595, 596, 597, 427/128, 129, 130, 131, 126.2, 126.3, 126.6

[56] References Cited

U.S. PATENT DOCUMENTS

| | | | |
|---|---|---|---|
| 3,585,536 | 6/1971 | Braginski et al. | 333/31 |
| 3,617,381 | 11/1971 | Hanak | 117/235 |
| 3,634,933 | 1/1972 | Hanak | 29/603 |
| 3,710,438 | 1/1973 | Max et al. | 29/603 |
| 3,977,887 | 8/1976 | McIntosh | 106/46 |
| 4,095,199 | 6/1978 | Behn et al. | 333/70 R |
| 4,170,032 | 10/1979 | Yokoyama et al. | 360/120 |
| 4,238,215 | 12/1980 | Yokoyama et al. | 65/43 |
| 4,324,854 | 4/1982 | Beauchamp et al. | 430/296 |
| 4,451,521 | 5/1984 | Kaule et al. | 428/199 |
| 4,457,972 | 7/1984 | Griffith et al. | 428/334 |
| 4,477,319 | 10/1984 | Abe et al. | 204/56 R |
| 4,529,626 | 7/1985 | Baker et al. | 427/226 |
| 4,544,627 | 10/1985 | Takahashi et al. | 430/325 |
| 4,579,594 | 4/1986 | Nanao et al. | 106/287.24 |
| 4,585,348 | 4/1986 | Chastang et al. | 356/369 |
| 4,586,092 | 4/1986 | Martens et al. | 360/59 |
| 4,651,172 | 3/1987 | Watanabe et al. | 346/135.1 |
| 4,656,052 | 4/1987 | Satou et al. | 427/38 |
| 4,668,299 | 5/1987 | Nanao et al. | 106/309 |
| 4,691,983 | 9/1987 | Kobayashi et al. | 350/96.12 |
| 4,717,584 | 1/1988 | Aoki et al. | 427/38 |
| 4,726,988 | 2/1988 | Oka et al. | 428/307.3 |
| 4,737,947 | 4/1988 | Osato et al. | 369/13 |
| 4,769,549 | 9/1988 | Tsuchino et al. | 250/484.1 |
| 4,777,082 | 10/1988 | Ishizaki et al. | 428/216 |
| 4,816,292 | 3/1989 | Machida | 427/38 |
| 4,819,113 | 4/1989 | Kubota et al. | 360/126 |
| 4,820,046 | 4/1989 | Sohma et al. | 356/328 |
| 4,822,675 | 4/1989 | Funkenbusch et al. | 428/336 |
| 4,841,515 | 6/1989 | James | 369/100 |
| 4,874,735 | 10/1989 | O'Brien et al. | 502/159 |
| 4,888,211 | 12/1989 | Oka et al. | 427/130 |
| 4,890,379 | 1/1990 | Yohda et al. | 29/603 |
| 4,908,226 | 3/1990 | Kubena et al. | 427/38 |
| 4,910,072 | 3/1990 | Morgan et al. | 428/212 |
| 4,918,409 | 4/1990 | Lamberty | 333/1.1 |
| 4,933,052 | 6/1990 | O'Brien et al. | 204/58.5 |
| 4,935,070 | 6/1990 | Ara et al. | 148/122 |
| 4,947,463 | 8/1990 | Matsuda et al. | 219/121.85 |
| 4,948,460 | 8/1990 | Sandaiji et al. | 156/630 |
| 4,952,295 | 8/1990 | Kawabata et al. | 204/192.15 |
| 4,960,651 | 10/1990 | Pettigrew et al. | 428/607 |
| 4,973,159 | 11/1990 | Sohma et al. | 356/328 |
| 4,975,324 | 12/1990 | Torii et al. | 428/329 |
| 4,975,389 | 12/1990 | Ryan et al. | 437/197 |
| 4,982,302 | 1/1991 | Kitamoto et al. | 360/134 |
| 4,999,260 | 3/1991 | Saito et al. | 428/694 |
| 5,015,972 | 5/1991 | Cygan et al. | 333/32 |
| 5,145,713 | 9/1992 | Venkatesan et al. | 427/561 |
| 5,168,097 | 12/1992 | Araya et al. | 427/596 |
| 5,203,929 | 4/1993 | Takayanagi et al. | 427/597 |

Primary Examiner—Marianne Padgett
Attorney, Agent, or Firm—Weingarten, Schurgin, Gagnebin & Hayes

[57] ABSTRACT

A method is provided for fabricating a thin film of ferrite material upon a variety of substrates wherein pulsed high power laser light impinges upon a target of ferrite material causing localized vaporization of the ferrite material and subsequent deposition upon a proximate substrate. The rapidity with which the target material is vaporized promotes chemical stability during ferrite film growth. Both the target and the substrate are maintained inside a vacuum chamber, and are maintained substantially within a temperature range of 550°–900° C. The equipment needed to practice the method is relatively inexpensive. Furthermore, the method allows for the large-scale production of high quality ferrite films with preferential magnetic texture, wherein the magnetization of the ferrite material aligns in a preferred direction in the plane of the film.

25 Claims, 2 Drawing Sheets

५,३२०,८८१

FABRICATION OF FERRITE FILMS USING LASER DEPOSITION

This is a continuation-in-part application of U.S. Ser. No. 07/750,626, filed Aug. 27, 1991, now U.S. Pat. No. 5,227,204, issued Jul. 13, 1993.

FIELD OF THE INVENTION

This invention relates to a method for the fabrication of ferrite films.

BACKGROUND OF THE INVENTION

It is known to fabricate ferrite films using a technique called liquid phase epitaxy. In this technique, a substrate is dipped into a molten liquid flux of ferrite material. However, the substrate must be of high purity and regularity, requiring the use of single crystal material. Also, due to the high cost of the equipment used, this approach is expensive.

RF sputtering is an alternative method for fabricating ferrite films wherein a beam of ions, e.g., argon ions, impinge upon a target of ferrite material. Evaporation of ferrite material is thereby induced, being subsequently deposited upon a nearby substrate. However, the yield rate of good quality ferrite films is quite low.

Another technique involves spinning a substrate while spraying ferrite particles upon the substrate. Relatively poor quality films result.

SUMMARY OF THE INVENTION

A method for fabricating a thin film of ferrite material upon a variety of substrates is provided wherein pulsed high power laser light impinges upon a target of ferrite material causing localized vaporization and subsequent deposition upon a proximate substrate. The rapidity with which the target material is vaporized promotes chemical stability during film growth. Useful substrate materials include semiconductors, glasses, ceramics, and metals. Particularly useful substrate materials include magnesium oxide (MgO) and strontium gallium oxide ($SrGa_{12}O_{19}$). Other substrate materials include amorphous quartz ($SiO_2$), glass, and $(Gd_aY_bCa_cR_d)_3$-$(Ga_eAl_f)_5O_{12}$, where $a+b+c+d=1$, $0 \leq a \leq 1$, $0 \leq ab \leq 1$, $0 \leq c \leq 1$, $0 \leq d \leq 1$ and R represents any mixture of any number of rare earth elements, including a mixture with only one rare earth element, where $e+f=1$ and $0 \leq e \leq 1$, $0 \leq f \leq 1$, such as $Gd_3Ga_5O_{12}$ (GGG), for example. Both the target and the substrate are maintained inside a vacuum chamber, where the pressure is preferably maintained at approximately 100–300 millitorr. Also, the target and the substrate are maintained within a temperature range of 550°–900° C. A heated substrate promotes the growth of hexagonal ferrites, for example, wherein the C-axis of a hexagonal ferrite is oriented perpendicularly to the surface of the film.

The method allows the use of practically any type of substrate material, so long as the surface of the substrate is smooth, i.e., with a surface roughness measure of no more than about 100Å. Also, the equipment needed to practice the method is relatively inexpensive. Furthermore, the method allows for the large-scale production of high quality ferrite films with preferential magnetic texture. Such high quality ferrite films have commercial application in microwave devices involving non-reciprocal applications, including isolators, circulators, switches, filters, modulators, and limiters. Additionally, the invention provides a technique for growing hexagonal, spinel and garnet ferrites.

DESCRIPTION OF THE DRAWING

The invention will be more fully understood from the following detailed description, in conjunction with the accompanying figures, in which.

DETAILED DESCRIPTION OF THE INVENTION

Figure 1:
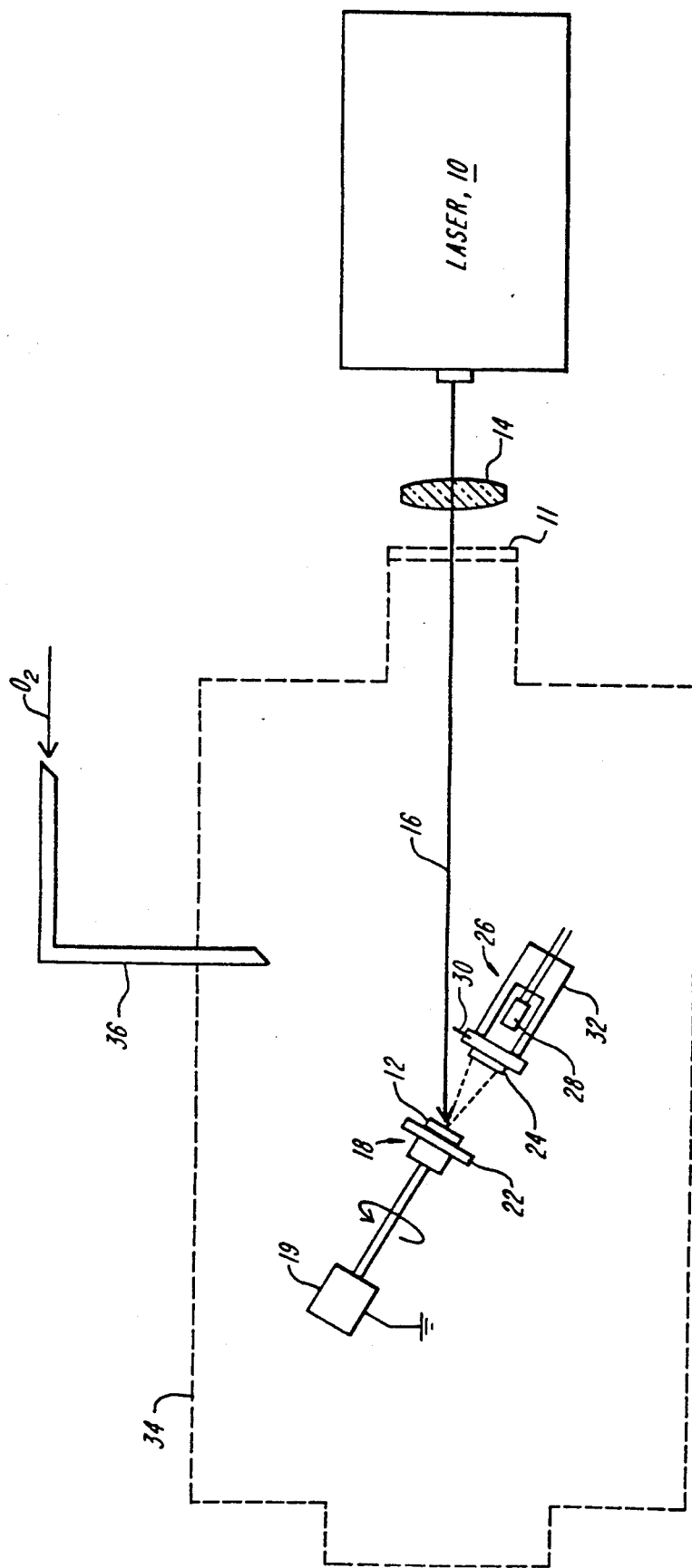
FIG. 1 is a schematic diagram of a deposition system for practicing the method of the invention.

With reference to FIG. 1, a high power pulsed laser 10, such as a LAMBDA PHYSIK Model EMG 103 excimer laser, is directed through a quartz window 11 and towards a flat, cylindrical target pellet 12 of ferrite material to be vaporized. The laser 10 produces a pulse train at a rate of 4 Hz, wherein each pulse imparts 250 mJ of laser energy at a wavelength of 248 nm, and at an energy density of approximately 2 J/cm. In a preferred embodiment, a lens 14 is interposed between the laser 10 and the target pellet 12 to further focus and collimate a beam of light 16 produced by the laser 10. The lens has, for example, a 50 cm focal length.

The pellet 12 is thermally mounted upon a chuck assembly 18 which is electrically grounded. Also, the chuck assembly 18 is driven by a motor 19 into rotation about a central axis 20 at a rate of, for example, 0.05 revolutions per second. In this embodiment, the normal to the surface of the pellet 12 is inclined by 45° with respect to the axis of rotation of the chuck assembly 18.

When a pulse of laser light impinges upon the pellet 12, ferrite material vaporizes, consequently moving towards a substrate 24 and being deposited thereon. The substrate 24 is maintained within a temperature range in accordance with the type of substrate material used, and the type of ferrite to be grown upon the substrate. The substrate 24 is maintained at a distance of approximately 3 cm from the pellet 12 by a substrate holder assembly 26. The substrate holder assembly 26 is electrically isolated. The substrate is maintained within a particular temperature range by means of electrical heaters 30 attached to the block holding the substrate. The temperature is controlled using a temperature measuring device, such as a thermocouple 28. Typically, the holder assembly 26 is maintained at a temperature of 600° C. Additionally, the substrate holder assembly 26 includes a radiation shield 32 to protect the substrate from the effects of ambient ionizing radiation.

The assembly 18, the pellet 12, the substrate 24, and the substrate holder assembly 26 reside within a vacuum chamber 34 which is maintained at a pressure of approximately $4 \times 10^{-8}$ torr prior to vaporization and deposition of the ferrite material upon the substrate 24. The partial pressure of oxygen is maintained at about 100 mtorr using a controlled flow of oxygen via tube 36 into the vacuum chamber 34. Thin films (approximately 500 nm) of exclusively c-axis oriented $BaFe_{12}O_{19}$ can be deposited in situ in less than 30 minutes.

Figure 2:
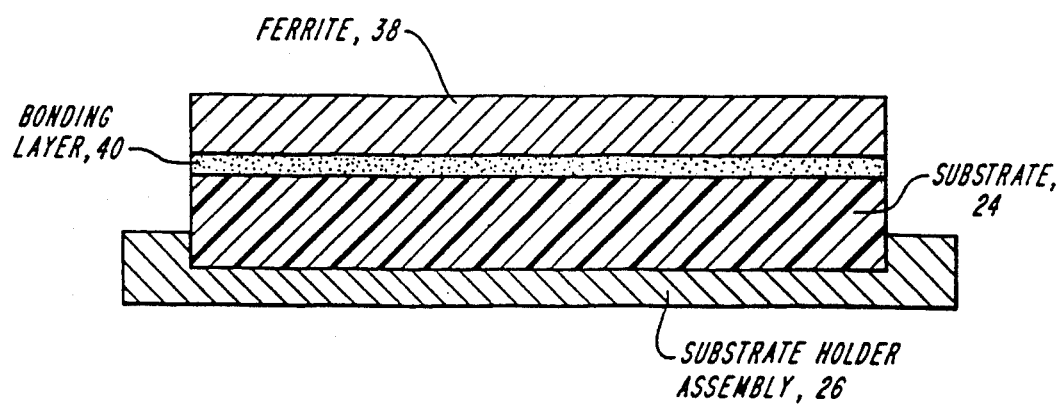
FIG. 2 is a diagrammatic, exaggerated cut-away side view of a ferrite thin film fabricated on a substrate by the method of the invention.

More particularly, for example, referring to FIG. 2, to form a film of barium ferrite ($BaFe_{12}O_{19}$) 38, a magnesium oxide (MgO) or sapphire or $SrGa_{12}O_{19}$ substrate 24 is used. The substrate 24 is maintained within a temperature range of 550°–900° C. If the temperature is not kept generally within this range, the film will tend to include multi-phase structures, such as spinels and other materials of ferrite hexagonal composition. In a preferred embodiment of the method of the invention, an intermediate bonding layer 40 can be used to promote adhesion of the ferrite layer 38 to the substrate 24, as well as to promote desirable crystalline structure. In this instance, the material $Mn_jMg_k(Al_mZn_nGa_oCu_pMg_qNi_r)_sFe_t)_2O_4$ where $j+k=1$ and $0 \leq j \leq 1$, $0 \leq k \leq 1$, where $m+n+o+p+q+r=1$, and $0 \leq m \leq 1$, $0 \leq n \leq 1$, $0 \leq o \leq 1$, $0 \leq p \leq 1$, $0 \leq q \leq 1$, $0 \leq r \leq 1$, and where $s+t=1$ and $0 \leq s \leq 1$, $0 \leq t \leq 1$, such as manganese ferrite ($MnFe_2O_4$) can aid in the growth of the Barium ferrite film layer 38.

To obtain cubic ferrites, such as the spinel and garnet ($B_3C_5O_{12}$) ferrites, where A represents a transition metal ion or combination of various transition metal ions, B represents a rare earth ion or yttrium or calcium, for example, and C represents a transition metal ion or combination of various transition metal ions, the substrate 24 consists essentially of MgO maintained at a temperature generally with the range of 500°-950° C. The lower end of this temperature range corresponds to the transition temperature between the amorphous and crystalline phases, and the upper end of the range corresponds to the temperature that is associated with significant ionic diffusion between the substrate and the ferrite film. Since films of high purity are desired, ionic diffusion is to be avoided. Ideally, for the growth of spinal ferrites MgO is the preferred substrate, or one could use the material $Mn_jMg_k(Al_mZn_nGa_oCu_pMg_qNi_r)_sFe_t)_2O_4$ where $j+k=1$ and $0 \leq j \leq 1$, $0 \leq k \leq 1$, where $m+n+o+p+q+r=1$, and $0 \leq m \leq 1$, $0 \leq n \leq 1$, $0 \leq o \leq 1$, $0 \leq p \leq 1$, $0 \leq q \leq 1$, $0 \leq r \leq 1$, and where $s=1$ and $t=0$, i.e., no iron (Fe) is present. For garnet ferrites, GGG is a preferred substrate material, or any other material with the formula where $(Gd_aY_bCa_cR_d)_3(Ga_eAl_f)_5O_{12}$, where $a+b+c+d=1$, $0 \leq a \leq 1$, $0 \leq b \leq 1$, $0 \leq c \leq 1$, $0 \leq d \leq 1$, and R represents any mixture of any number of rare earth elements, including a mixture with only one rare element, where $e+f=1$ and $0 \leq e \leq 1$, $0 \leq f \leq 1$. It may be possible to change the composition of the substrate slightly in order to improve the lattice constant mismatch between film and substrate.

To form hexagonal films, a substrate with a hexagonal lattice structure is used. For example, if hexagonal barium ferrite is desired, $SrGa_{12}O_{19}$, having a hexagonal structure, is preferable. Analogously, to form a film with a cubic lattice structure, a cubic substrate, such as MgO is used.

A substrate can be chosen that consists essentially of $(Gd_aY_bCa_cR_d)_3(Ga_eAl_f)_5O_{12}$, where $a+b+c+d=1$, $0 \leq a \leq 1$, $0 \leq b \leq 1$, $0 \leq c \leq 1$, $0 \leq d \leq 1$, and R represents any mixture of any number of rare earth elements, including a mixture with only one rare earth element, where $e+f=1$ and $0 \leq e \leq 1$, $0 \leq f \leq 1$. For example, when $a=1$ and $b=c=d=0$, and $e=1$ and $f=0$, the substrate is $Gd_3Ga_5O_{12}$, which is useful for growing garnet films. Also, when there are equal amounts of Gd and Ca, for example, $a=0.5$, $b=0$, $c=0.5$, $d=0$. Thus, the substrate consists of $Gd_{1.5}Ca_{1.5}Ga_5O_{12}$.

The rare earth elements include Ce, Pr, Nd, Pm, Sm, Eu, Gd, Tb, Dy, Ho, Er, Tm, Yb, and Lu. R can be any mixture of rare earth elements, such as the mixture $Ce_{0.79}Er_{0.12}Lu_{0.09}$. Note that the fractions of the components of the mixture add up to 1.0. Thus, when $d=e=1$ and $a=b=c=f=0$, the substrate is $Ce_{2.37}Er_{0.36}Lu_{0.27}Ga_5O_{12}$. The mixture consisting solely of Tm is also possible, where no significant amount of any other rare earth element is present. Thus, the substrate would be $Tm_3Ga_5O_{12}$, when $a=b=c=f=0$.

In another embodiment, the substrate consists essentially of $Sr_xBa_yPb_z(Ga_uAl_v)_{12}O_{19}$, where $x+y+z=1$ and $0 \leq x \leq 1$, $0 \leq y \leq 1$, $0 \leq z \leq 1$, and where $u+v=1$ and $0 \leq u \leq 1$, $0 \leq v \leq 1$. For example, $Sr_{0.5}Pb_{0.5}Ga_4Al_8O_{19}$ is a useful substrate material. $SrGa_{12}O_{19}$ can be used to grow hexagonal ferrites.

The material $Mn_jMg_k(Al_mZn_nGa_oCu_pMg_qNi_r)_sFe_t)_2O_4$ where $j+k=1$ and $0 \leq j \leq 1$, $0 \leq k \leq 1$, where $m+n+o+p+q+r=1$, and $0 \leq m \leq 1$, $0 \leq n \leq 1$, $0 \leq o \leq 1$, $0 \leq p \leq 1$, $0 \leq q \leq 1$, $0 \leq r \leq 1$, and where $s+t=1$ and $0 \leq s \leq 1$, $0 \leq t \leq 1$, can be used as a substrate material, or can be used as an intermediate bonding layer to promote enhanced adhesion and crystal structure of a crystalline ferrite film to be formed, such as a ferrite film with hexagonal or cubic symmetry, e.g., garnet. Amorphous quartz ($SiO_2$) and glass can also be used as substrate materials for growing polycrystalline ferrite films.

To achieve crystallinity, the substrate is heated to 750° C.

It has been observed that the flow of oxygen within the vacuum chamber is best maintained at a partial pressure of oxygen of approximately 100 mtorr in the vicinity of the substrate during formation of the ferrite film.

Other modifications and implementations will occur to those skilled in the art without departing from the spirit and the scope of the invention as claimed. Accordingly, the above description is not intended to limit the invention except as indicated in the following claims.

What is claimed is:

1. A method for forming crystalline ferrite films comprising the steps of:
   choosing a substrate that consists essentially of a material selected from the group consisting of magnesium oxide, sapphire, $SrGa_{12}O_{19}$, and $MnFe_2O_4$;
   enclosing within a vacuum chamber both a ferrite target and the substrate, upon which substrate a ferrite film is to be formed;
   heating said substrate to a temperature generally within the range of 500° to 950° C.;
   maintaining a flow of oxygen in the vicinity of the substrate; and
   directing laser light towards said ferrite target to initiate rapid vaporization of at least a portion of said ferrite target, and subsequent deposition of ferrite material upon a first surface of said substrate to form a crystalline ferrite film having an orientation aligned with a central axis substantially perpendicular to the first surface of said substrate.

2. The method of claim 1 wherein the flow of oxygen within the vacuum chamber maintains a partial pressure of oxygen of approximately 300 mtorr in the vicinity of the substrate during formation of said ferrite film.

3. The method of claim 1 wherein the ferrite target is disposed at a distance from said substrate, the distance chosen so as to promote deposition of ferrite material upon said substrate.

4. The method of claim 1 wherein said ferrite target is rotated during the step of firing said laser.

5. The method of claim 1 wherein said laser is directed obliquely at said ferrite target.

6. The method of claim 1 wherein said laser is a pulsed laser of a power sufficient to vaporize at least said portion of said ferrite target.

7. The method of claim 1 wherein said laser is focused by an intervening lens.

8. The method of claim 1 wherein said target is electrically grounded.

9. The method of claim 1 wherein said substrate has been precoated with an intermediate bonding layer to promote enhanced adhesion and crystal structure of a ferrite film to be formed.

10. The method of claim 1 wherein after said ferrite film has been formed, the film is bathed in oxygen gas at room temperature and pressure.

11. The method of claim 1 wherein said substrate is radiantly heated.

12. The method of claim 1 wherein said substrate is shielded from ionizing radiation.

13. A method for forming crystalline ferrite films comprising the steps of choosing a substrate that consists essentially of a material selected from the group consisting of:

$(Gd_aY_bCa_cR_d)_3(Ga_eAl_f)_5O_{12}$;

$Mn_jMg_k((Al_mZn_nGa_oCu_pMg_qNi_r)_sFe_t)_2O_4$;

$Sr_xBa_yPb_z(Ga_uAl_v)_{12}O_{19}$;

amorphous quartz; and glass;

where $a+b+c+d=1$, $0 \leq a \leq 1$, $0 \leq b \leq 1$, $0 \leq c \leq 1$, $0 \leq d \leq 1$, and R represents any mixture of any number of rare earth elements, including a mixture with only one rare earth element, where $e+f=1$ and $0 \leq e \leq 1$, $0 \leq f \leq 1$, where $j+k=1$ and $0 \leq j \leq 1$, $0 \leq k \leq 1$, where $m+n+o+p+q+r=1$, and $0 \leq m \leq 1$, $0 \leq n \leq 1$, $0 \leq o \leq 1$, $0 \leq p \leq 1$, $0 \leq q \leq 1$, $0 \leq r \leq 1$, where $s+t=1$ and $0 \leq s \leq 1$, $0 \leq t \leq 1$, where $x+y+z=1$ and $0 \leq x \leq 1$, $0 \leq y \leq 1$, $0 \leq z \leq 1$, and where $u+v=1$ and $0 \leq u \leq 1$, $0 \leq v \leq 1$;

enclosing within a vacuum chamber both a ferrite target and the substrate, upon which substrate a ferrite film is to be formed;

heating the substrate to a temperature generally within the range of 550° C. to 950° C.;

maintaining a flow of oxygen in the vicinity of the substrate; and directing laser light towards the ferrite target to initiate rapid vaporization of at least a portion of the ferrite target, and subsequent deposition of ferrite material upon a first surface of the substrate to form a crystalline ferrite film having an orientation aligned with an axis substantially perpendicular to the first surface of said substrate.

14. The method of claim 13 wherein the substrate is heated to 750° C.

15. The method of claim 13 further including the step of:

before the step of enclosing, depositing an intermediate layer of material, selected from the group consisting of:

glass; and $Mn_jMg_k(Al_mZn_nGa_oCu_pMg_qNi_r)_sFe_t)_2O_4$; where $j+k=1$ and $0 \leq j \leq 1$, $0 \leq k \leq 1$, where $m+n+o+p+q+r=1$, and $0 \leq m \leq 1$, $0 \leq n \leq 1$, $0 \leq o \leq 1$, $0 \leq p \leq 1$, $0 \leq q \leq 1$, $0 \leq r \leq 1$, and $s+t=1$ and $0 \leq s \leq 1$, $0 \leq t \leq 1$.

16. The method of claim 13 wherein the flow of oxygen within the vacuum chamber maintains a partial pressure of oxygen of approximately 100 mtorr in the vicinity of the substrate during formation of the ferrite film.

17. The method of claim 13 wherein the ferrite target is disposed at a distance from the substrate, the distance chosen so as to promote the deposition of ferrite material upon the substrate.

18. The method of claim 13 wherein the laser is directed obliquely at the ferrite target.

19. The method of claim 13 wherein the laser is a pulsed laser of a power sufficient to vaporize at least the portion of the ferrite target.

20. The method of claim 13 wherein the laser is focused by an intervening lens.

21. The method of claim 13 wherein the target is electrically grounded.

22. The method of claim 13 wherein the substrate has been precoated with an intermediate bonding layer to promote enhanced adhesion and crystal structure of a ferrite film to be formed.

23. The method of claim 13 wherein after the ferrite film has been formed, the film is bathed in oxygen gas at room temperature and pressure.

24. The method of claim 13 wherein the substrate is radiantly heated.

25. The method of claim 13 wherein the substrate is shielded from ionizing radiation.

* * * * *

UNITED STATES PATENT AND TRADEMARK OFFICE
CERTIFICATE OF CORRECTION

PATENT NO. : 5,320,881
DATED : June 14, 1994
INVENTOR(S) : Carmine Vittoria

It is certified that error appears in the above-indentified patent and that said Letters Patent is hereby corrected as shown below:

Column 2, line 62, "in situ" should read --<u>in situ</u>--.

Column 3, line 14, "spinel and garnet" should read --spinel ($A_2O_4$) and garnet--.

Column 4, line 54, "the flow" should read --said flow--.

Signed and Sealed this

Seventh Day of February, 1995

Attest:

BRUCE LEHMAN

*Attesting Officer*  *Commissioner of Patents and Trademarks*